United States Patent [19]

Larson

[11] 4,262,071
[45] Apr. 14, 1981

[54] OPTICAL ENHANCEMENT OF COLOR PROOFING IMAGES

[75] Inventor: Gerald W. Larson, Stillwater, Minn.

[73] Assignee: Minnesota Mining and Manufacturing Company, St. Paul, Minn.

[21] Appl. No.: 68,071

[22] Filed: Aug. 20, 1979

[51] Int. Cl.³ .............................................. G03F 5/00
[52] U.S. Cl. .................................. 430/11; 430/14; 430/15; 430/17; 430/143; 430/162; 430/293; 430/358
[58] Field of Search ............... 430/162, 394, 143, 358, 430/11, 17, 14, 293, 15; 428/331

[56] References Cited

U.S. PATENT DOCUMENTS

| 3,046,127 | 7/1962 | Barney et al. | 430/281 |
|---|---|---|---|
| 3,060,025 | 10/1972 | Burg et al. | 430/291 |
| 3,549,373 | 12/1970 | Hamada et al. | 430/143 X |
| 3,615,435 | 10/1971 | Chu et al. | 430/293 X |
| 3,649,268 | 3/1972 | Chu et al. | 430/293 |
| 3,671,236 | 6/1972 | Beusekom | 430/293 |
| 3,764,318 | 10/1973 | Laridon | 430/143 |
| 3,811,882 | 5/1974 | Henry | 430/358 X |
| 3,905,815 | 9/1975 | Bonham | 430/293 X |

OTHER PUBLICATIONS

Sigg, Technical Assoc. of the Graphic Arts, 1970 Annual Book, pp. 197–213.

*Primary Examiner*—Edward C. Kimlin
*Attorney, Agent, or Firm*—Cruzan Alexander; Donald M. Sell; Mark A. Litman

[57] ABSTRACT

Pre-press or photomechanical color proofs of half-tone printed products do not faithfully match the color tone values of the final half-tone printed product. This problem occurs from the fact that the printing press, in its mechanical operation, produces half-tone dots on the substrate which are larger than the dots on the printing plate or separation negative itself. It has been found that the proper tonal values for gauging the final results from the press can be obtained in the pre-press color proof by the insertion of a spacer layer between the opaque base and the applied pigment or dye containing layers.

7 Claims, 5 Drawing Figures

OPTICAL ENHANCEMENT OF COLOR PROOFING IMAGES

BACKGROUND OF THE INVENTION

It is highly desirable to inspect the image that will be produced from a printing process prior to the start of on-line printing operations. This is particularly true in color printing processes where both image resolution and color quality must correlate with the original subject matter. An inspection of the proofing image before actual printing of the image provides the operator with an opportunity to adjust the press, plate, ink, film separations, and other conditions to produce a printed product with the desired characteristics.

As is known in the art, color separations can be made from originals, employing red, green and blue filters. The method of producing color separation negatives or positives from the originals is well know in the art. From the original color image, one goes by conventional routes to form positive or negative color separations representing the red, green, and blue record of the original. For the lithographic process, it is of course, required that these records be half-tone renditions. These half-tone separations may be used at this point to form printing plates or pre-press proofs.

Color separations made from the original image may represent a faithful replication of tonal values, and the proofing methods used to make colored representations of these half-tone separations may also reproduce the quality seen in the photomechanically produced originals. However, when these high quality color proofing separations are viewed against the output of a high quality printing press, the results do not always correspond, especially when mid-tone half-tone values are compared. This lack of correspondence is the result of the printing press producing a half-tone dot size on paper that is larger than the half-tone dots present on the printing plate or color separation itself. The net observable result is what is called in the trade as "press gain," produced by the action of a series of moving cylinders spreading out the ink on the final receptor sheet to cover a larger area than is represented by the imaged printing plate or color proofing originals.

These problems have been recognized in the printing trade and certain adjustments, or compensating techniques have been developed to adjust for these variations. However, prior to this invention, there have been no established reproducible processes capable of being accomplished in a non-chemical technical manner with presently available instrumentation for determining the degree of corrections needed.

Color proofing systems are well known and are disclosed in the prior art. The techniques of progressing from an original piece of colored art work through a series of color separations (either negatives or positives), the choice of appropriate color filters to create the specific color rendition on a piece of photographic film, and the use of these separations to generate color proofing separations are well known in the industry.

The methods of combining these individual color separations as well as the means of producing the proper color characteristics are the basis for many patents in this field of photomechanical technology.

U.S. Pat. No. 3,671,236 discloses a pigmented, composite structure on a temporary support capable of being laminated to printing stock, then exposed through a separation negative, and developed to remove the unwanted, nonexposed background sections of the color film. Repeating this process for the other colors comprising the original art work and firmly adhering these colored renditions in exact registration one over the other results in a colored, pictorial representation of the original colored piece.

An important aspect of this invention is the requirement that the clear, colorless pressure sensitive adhesive coated at a dry coating weight of about 200 mg/ft$^2$ be quite thin in relation to the amounts applied in making conventional pressure sensitive adhesive structures.

U.S. Pat. No. 3,649,268 discloses the use of a photopolymerizable structure which, when laminated and then exposed through a positive separation transparency, may be colored in the unexposed, tacky regions with a preselected toner powder chosen to match the particular separation color and the ink to be used on press. A multi-layer composite structure is prepared by repeating the coloring process for each of the separation positives and then repeating the steps of laminating, exposing and color to produce a single composite sheet.

Both of these disclosures of the prior art requires the use of transparent or at least translucent pigments or toner powders since viewing of all colors in the completed structure requires optical transparency through all the layers.

SUMMARY OF THE INVENTION

It has been found in the practice of the present invention that improved color tone values, more nearly duplicating those of a final half-tone print, surprisingly may be obtained in a color proof by the insertion of a transparent spacing layer between the opaque base and the applied half-tone dot color images. This improved color tone may be effected without the necessity of any modification of the press or chemistry involved in the printing or proofing operations.

DETAILED DESCRIPTION OF THE INVENTION

Figure 1:
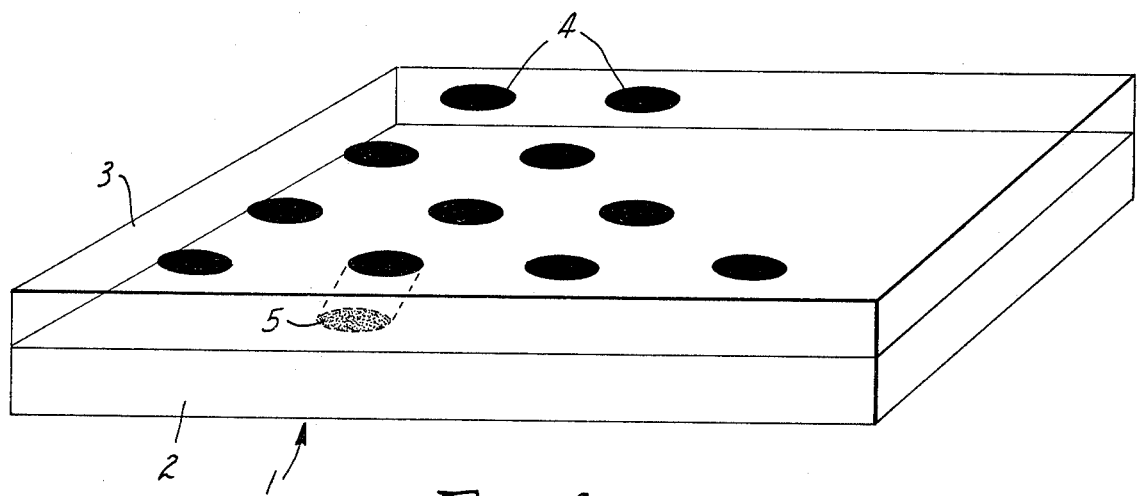
FIG. 1 shows a color proof according to the present invention with only one dot image and no carrier layer shown thereon.
Figure 2:
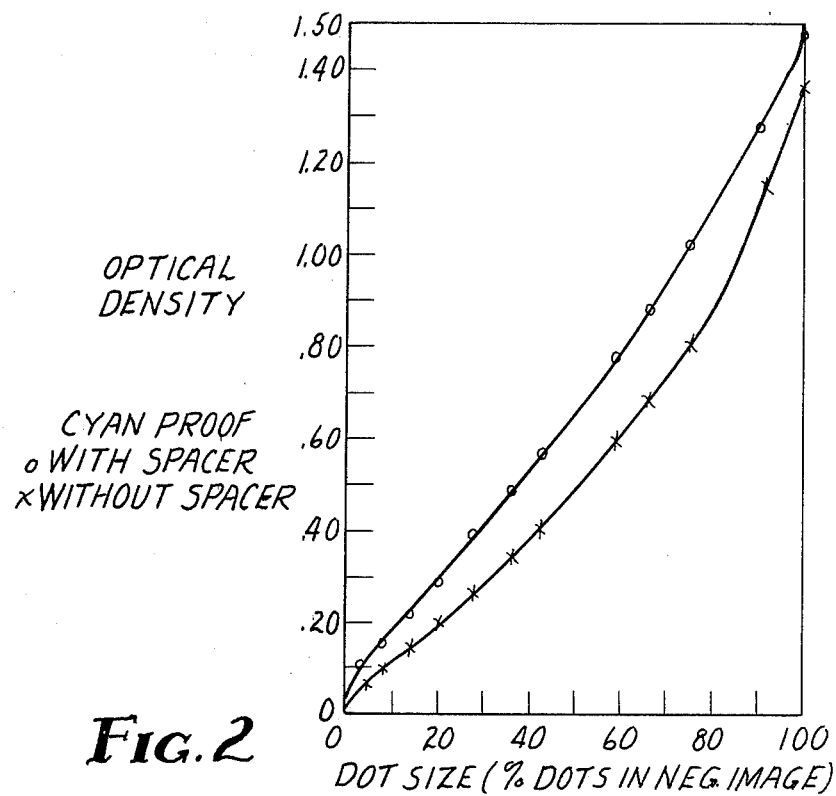
FIGS. 2-5 show the variation in optical density from 0 to 100% dot size in proofing images with and without spacer layers.
Figure 3:
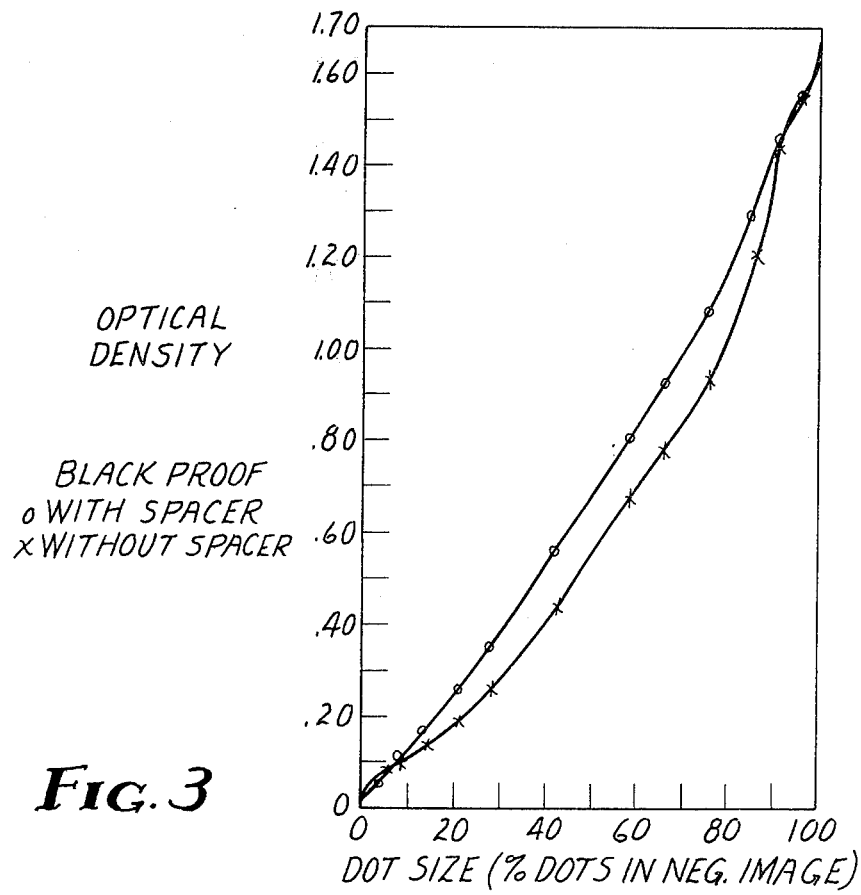
Figure 4:
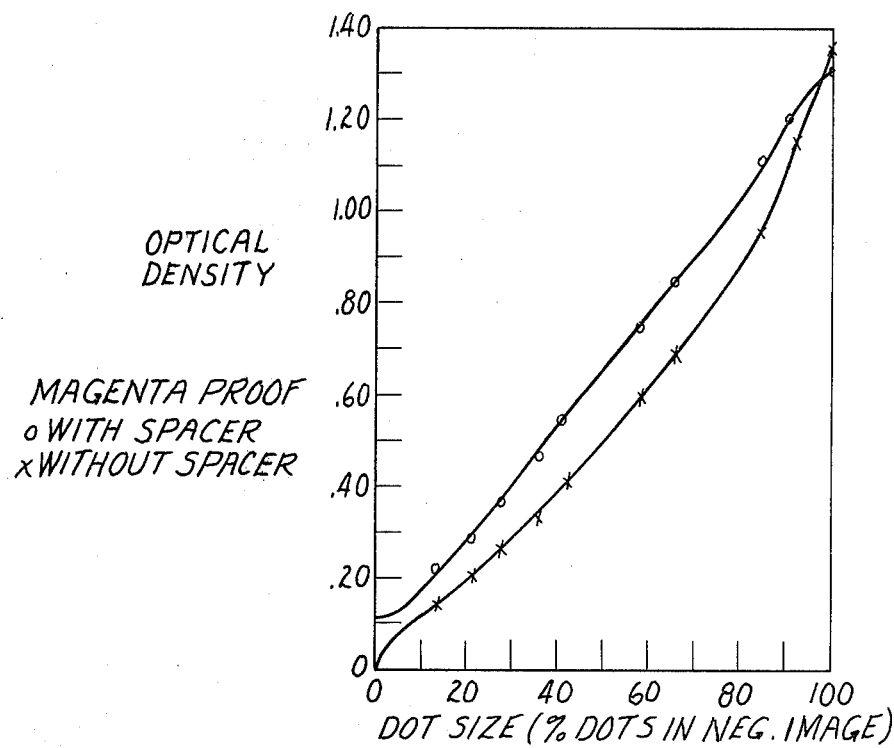
Figure 5:
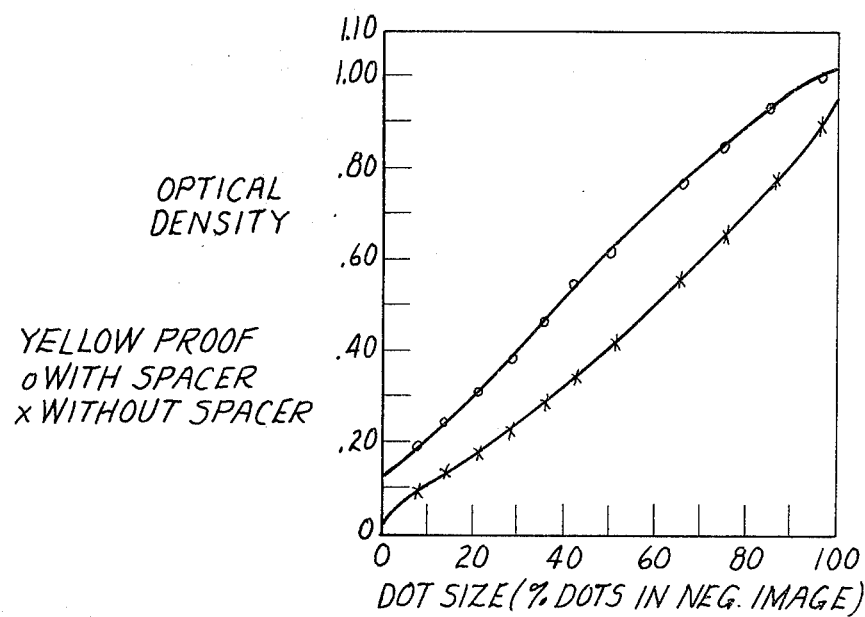

The final product of the present invention comprises an opaque base, a transparent spacer layer over at least one surface of the base, and at least one half-tone dot image on said spacer layer. Where an image is formed from more than one series of dots or dots of more than one color, all of the dots may be deposited onto the spacer layer or either additional spacer layers or separation layers may be used between the series of colors of dots.

A spacer layer according to the present invention is a transparent film layer, preferably an organic polymer layer, of between 0.7 to 5 mils in thickness. Preferably the layer is between 1 to 4 mils and most preferably is between 2 and 4 mils. The composition of the spacer layer is unimportant and may be any transparent and preferably colorless material, as for example, gelatin, polyester, cellulose acetate esters, polycarbonate, polyacrylic, polyvinyl resins (e.g., polyvinyl chloride, polyvinylidene chloride), olefinic resins (e.g., polyethylene, polypropylene), polysiloxane resin, etc.

The opaque base is preferably a white substrate and may be, for example, white paper, paper coated with white pigment, white pigmented polymer film or sheets, or any substrate the surface of which is white. The base may be any material representing the substrate to be used in the final product such as newsprint, plastic stock, unbleached paper, etc. The half-tone image on the spacer layer may be composed of dyes or pigments in a binder or any image forming substance. The binder may be any polymeric resin. The dots themselves may comprise either: (1) the dye or pigment in a binder alone; or (2) a dye or pigment in a binder with at least one other polymeric portion adhered thereto, depending upon the process by which the individually colored half-tone dot images are formed before or after being formed on the spacer layer. For example, when the colored half-tone dot images of U.S. Pat. No. 3,671,236 are transferred onto the spacer layer, an amount of diazo resin, coated onto the pigment in the binder, and the film transfer layer would be transferred to the spacer layer along with the dots. The present invention would also be applicable where preformed dots are transferred onto the spacer layer. The structures of the present invention therefor include proofs having films between the various color tone images.

The improved color tone characteristics of the present invention appear to result from additional color density and apparent dot size contributed by the shadow or the image projected onto the opaque substrate by light passing through the dye or pigment. With the spacer present between the half-tone dot and the opaque base, preferably bonded or laminated therebetween with no air space present, multiple internal reflections may occur which effectively reduce the intensity of the reflected light by absorption in the dots. This increased absorption may give the appearance of increased optical density. Reference to the figures will show this.

FIG. 1 shows a color proof according to the present invention with only one dot image and no carrier layer shown thereon. The proof 1 is composed of the opaque base 2, the transparent spacer 3, and the dots 4 making up the half-tone image. Light passing through or around the dots 4 cause shadows 5 or projections of the color of the dots on the surface of the opaque base 2. This is the effect which is believed to improve the tone quality of the proof and make it more compatible with the final printed image.

The dimensions of the spacer layer are critical. The spacer must be at least 0.7 mil thick for there to be any visually observable enhancement, and similarly should be no more than 5 mils thick. Preferably the spacer is 1 to 4 mils and most preferably is 2 to 4 mils thick.

The proofs of the present invention comprise the opaque base, a transparent spacer layer of from 0.7 to 5 mils thick comprising an organic polymer layer laminated to the opaque base, and at least one half-tone image on a transparent polymeric carrier film laminated to the spacer layer. The half-tone image is comprised of dyes or pigments in a binder, the dyes or pigment in the layer being of one color selected, for example, from yellow, cyan, magenta or black. The half-tone image on the carrier film is laminated to the spacer with the imaged side of the film bonded to the spacer or facing away from the spacer. It is preferred that the image carrying side of the film not be laminated to the spacer. This is because the carrier film with photopolymeric coating which forms the half tone image can be laminated to the spacer before imaging and development. If the imaged side of the film is away from the spacer, the total thickness of the spacer and carrier film would preferably still be between 0.7 to 5 mils.

Where a full color proof is being made, additional half-tone images on carrier films are laminated over the first half-tone image laminated to the spacer. These additional images on a film comprise half-tone images of each of the remaining colors of yellow, cyan, magenta and black. That is, if the first layer laminated to the spacer layer is yellow, the remaining layers are magenta, cyan and black. Each layer is, of course, comprised of essentially only one color.

These and other aspects of the invention will be shown in the following examples.

EXAMPLE 1

A 4 mil polyester film was laminated by heat and pressure to white paper. In the order of yellow, cyan, magenta, and black, four color proofing layers formed identically to Example 1 of U.S. Pat. No. 3,671,236 (including col. 4, lines 38–45) were respectively transferred to the polyester surface of the polyester coated paper. An identical article was prepared without the polyester coating.

Visual comparison of the two proofs showed a noticeable tone difference, with the polyester coated paper having generally greater apparent optical density using identical color separations and identical photosensitive layers.

EXAMPLE 2

Two separate color proofs were formed as in Example 1 except that the order of the color layers from the base was cyan, yellow, magenta, then black. Again, one set of color proofing images was on white paper and the other on white paper with 2 mil of polyester laminated to the paper on the side having the color proofing images thereon. Measurements were taken of the optical density for each color as a function of dot size. The dot size was measured as the dot percent of the imaged negative. The overall optical density of each layer of the article having the spacer layer was greater for a given dot size than the corresponding layer on the proof without the polyester spacer. FIGS. 2–5 show the variation in optical density from 0 to 100% dot size.

It is generally preferred to form the image on the spacer layer and then laminate the spacer layer to the base. This minimizes halation problems during exposure caused by reflection of light off of the opaque substrate. The image can, of course, be formed after the spacer layer has been laminated to a substrate.

EXAMPLE 3

In the order of yellow, magenta, cyan, and black, four color proofing layers formed identically to Example 1 were each sequentially laminated, exposed and developed, the yellow layer to a 3 mil polyester film and the remaining color layers sequentially on top of the yellow layer. This exposure on a clear backing reduces undesirable halation effects as compared to exposure on a spacer layer already laminated to an opaque substrate.

The polyester film with the four half-tone images thereon was then laminated by pressure sensitive adhesive to white paper.

An article was made for comparison by laminating, exposing and developing identical color proofing layers directly onto white paper.

Visual comparison of the two proofs showed noticeable tone differences, with the proof having the polyester spacer layer having a generally greater apparent optical density, even using the same color separations to prepare them.

EXAMPLE 4

A yellow proofing layer formed according to Example 1 of U.S. Pat. No. 3,136,637, with the blue pigment of that example replaced with the yellow pigment of Example 1 above, was coated onto 2 mil polyester film using a number 38 Meyer rod. This sheet was exposed, using the corresponding color separation negative, then developed. The remaining three color proofing layers were laminated, exposed and developed as in Example 3 above. The composite was then laminated to white paper with a pressure sensitive adhesive between the paper and the polyester film.

A similar article was prepared for comparison with the first color proofing layer coated directly onto white paper.

Again, visual examination of the two proofs showed that the proof having the clear spacer layer between the white base and the imaged had a generally better apparent optical density.

EXAMPLE 5

The yellow proofing layer of example 1 was laminated to a 2 mil polyester film then exposed and developed. A second 2 mil polyester film was laminated on top of the yellow-imaged sheet by means of a pressure sensitive adhesive. The cyan, magenta, and black proofing layers of Example 3 were then sequentially laminated, exposed and developed on the second polyester layer. The composite was then laminated by pressure sensitive adhesive to white paper.

A proof identical to this, without the polyester and adhesive layers, was prepared on white paper for comparison.

The proof having the two spacer layers showed greater apparent optical density.

EXAMPLE 6

Two proofs were prepared identically to those of Example 3 except that the opaque base was newsprint instead of white paper.

Visual comparison showed greater tone density in the proof having the the transparent spacer layer.

I claim:

1. A pre-press half-tone color proof for half-tone printed images comprising in sequence:
   (1) An opaque base;
   (2) A transparent spacer layer of from 0.7 to 5 mils thick comprising an organic polymer layer on one side of said opaque base;
   (3) At least one half-tone image on a transparent polymeric carrier film, said image comprising dyes or pigments selected from yellow, cyan, magenta, or black dyes or pigments in a polymeric binder said half-tone images on said transparent polymeric carrier film being laminated to said spacer layer.

2. The proof of claim 1 wherein said spacer layer is bonded to said opaque base.

3. The proof of claim 2, wherein said half-tone image on a transparent film comprises dyes or pigments of color selected only from one of the four colors yellow, cyan, magenta and black in a binder and the side of the film carrying said half-tone image is bonded to said spacer layer.

4. The proof of claim 2 wherein said half-tone image on a transparent film comprises dyes or pigments of only one of yellow, cyan, magenta and black in a binder and the side of the film away from the half-tone image is bonded to said spacer layer so that the thickness of the spacer layer and carrier film is between 0.7 and 5 mils.

5. The proof of claim 3 wherein in addition to said at least one half-tone image on a film, there are three additional half-tone images on transparent polymer films laminated over said at least one half-tone image on a film, each one of the three additional images on films corresponding to one of the colors yellow, cyan, magenta and black so that each additional half-tone image on a film is a color different from that so said at least one image on a film and comprises only one of the four colors, and each of the three additional half-tone image layers comprise different colors from one another.

6. The proof of claim 5 wherein each of said additional half-tone images on a film are laminated to said at least one half-tone image on a film with the side of each additional film carrying the half-tone image facing the opaque layer.

7. The proof of claims 1–6 in which said spacer layer is between 1 and 4 mils thick.

* * * * *